United States Patent [19]
Anders, Jr. et al.

[11] Patent Number: 5,522,963
[45] Date of Patent: Jun. 4, 1996

[54] METHOD FOR MACHINING AND DEPOSITING METALLURGY ON CERAMIC LAYERS

[75] Inventors: Robert H. Anders, Jr., Owego; William Cobbett, Jr., New Paltz; William T. Grant, Pleasant Valley; Mark W. Kapfhammer, Fishkill, all of N.Y.; Nabil A. Rizk, Cary, N.C.; Nirmal S. Sandhu, Hopewell Junction; Mohamad A. Sarfaraz, Poughkeepsie, both of N.Y.; You-Wen Yau, Hsin-Chu, Taiwan

[73] Assignee: International Business Machines Corporation, Armonk, N.Y.

[21] Appl. No.: 251,538

[22] Filed: May 31, 1994

[51] Int. Cl.$^6$ ........................ B05D 1/32
[52] U.S. Cl. ........................ 156/272.8; 156/344; 156/247; 156/256; 427/282; 427/272; 427/287; 427/269
[58] Field of Search ........................ 156/344, 272.2, 156/272.8, 89, 247, 248, 256; 427/282, 287, 272, 269, 126.1, 102

[56] References Cited

U.S. PATENT DOCUMENTS

| | | | |
|---|---|---|---|
| 3,668,028 | 6/1972 | Short | 156/272.8 |
| 3,948,706 | 4/1976 | Schmeckenbecher . | |
| 3,956,052 | 5/1976 | Koste et al. | 156/247 |
| 4,420,365 | 12/1983 | Lehrer | 427/282 X |
| 4,467,170 | 8/1984 | Hata et al. | 219/121 |
| 4,673,609 | 6/1987 | Hill . | |
| 4,720,315 | 1/1988 | Greenman | 156/233 |
| 4,964,945 | 10/1990 | Calhoun | 427/282 X |
| 5,124,522 | 6/1992 | Booke et al. | 219/121.19 |
| 5,145,551 | 9/1992 | Booke et al. . | |

FOREIGN PATENT DOCUMENTS

| | | | |
|---|---|---|---|
| 60-208752 | 10/1985 | Japan | 156/344 |
| 62-154793 | 7/1987 | Japan | 156/344 |

OTHER PUBLICATIONS

Martin et al., "Glass Mask Protection and Particulate Cleaning", IBM Technical Disclosure Bulletin.
Slayton, "Removal of Metal Masks by Ultrasonic Agitation", IBM Technical Disclosure Bulletin.

*Primary Examiner*—David A. Simmons
*Assistant Examiner*—Steven J. Helmer
*Attorney, Agent, or Firm*—Perman & Green

[57] ABSTRACT

Method for thermally-machining large area features, and screen-depositing metallurgy on a ceramic dielectric greensheet. The method comprises an improvement over the conventional integrated disposable mask process, and involves the steps of outlining the large feature areas through a masking film laminated to a greensheet, using a high intensity energy beam such as a laser beam, electron beam, photon beam, etc, forming a stencil sheet having corresponding large area feature openings, and laminating the stencil sheet in registration over the masking film. An adhesive sheet is pressed against the back of the stencil sheet, through the stencil openings, to adhere to the outline features on the masking film and to remove them when the stencil sheet is separated from the masking film. Conductive paste is applied to the greensheet, through the large feature openings in the masking film, and the electroded greensheet is fired for use in preparing multi-layer ceramic packages.

15 Claims, 2 Drawing Sheets

METHOD FOR MACHINING AND DEPOSITING METALLURGY ON CERAMIC LAYERS

BACKGROUND OF THE INVENTION

1. Field of the Invention

The present invention relates to an improved method for forming wide area features on green ceramic dielectric layers for forming multi-layer ceramic substrates for electronic applications, and for metallizing said wide area features with electroconductive paste composition without contaminating adjacent surface areas of the dielectric green layers.

2. Discussion of State of the Art

It is known to form vias and circuit outlines on greensheets or layers of dielectric composition, and to fill said vias or circuit outlines with electroconductive paste composition to produce X- and Y- interconnections with electrical circuits printed on said dielectric sheets or on contacting surfaces of adjacent dielectric sheets, and to produce transverse conductive pads and vias providing conductive interconnections with portions of conductive circuits printed on other dielectric sheets of the multi-layer ceramic substrate which are otherwise insulated therefrom and/or insulated from the electrical leads of the MLC substrate.

A preferred method for forming complex and high precision vias and recessed channels and/or fine, closely-spaced lines in green ceramic layers, and for filling said vias and channels with the electroconductive paste without the need for precision printing systems or preformed masks and alignment systems is disclosed in commonly-assigned U.S. Pat. Nos. 3,948,706, 3,956,052 and 5,145,551. The methods of these patents comprise heat-and-pressure laminating a thin, inert metallized film of a thermoplastic organic polymer to the surface of the dielectric greensheet, thermally machining the vias and/or circuit outlines through the film and into and/or through the greensheet, using electron beam or laser radiation to ablate and remove the film and the greensheet composition from the affected areas. Next an electroconductive paste is wiped over the film and deposited in the via areas and/or circuit areas to fill said areas while the other surface areas of the dielectric greensheet are masked by the film against contact therewith. Finally, the surface film is peeled away, and the electroded greensheet is assembled with other similar conducting and insulating layers to form a MLC which is fired to form a unitary component.

The prior known methods are extremely useful for the formation of narrow vias and fine-line recesses but are inefficient for the total removal of larger masses of masking film for the metallizing of large features such as seal bands, wire bond pads and I/O pin pads.

SUMMARY OF THE INVENTION

The present invention relates to an improved method for machining and removing larger feature areas of masking film, corresponding to seal bands, wire bond pads and I/O pin pads, from masking film/greensheet laminates, prior to the application of electroconductive paste composition to fill such seal band, wire bond pad and I/O pin pad areas of the film and form corresponding electroded areas on the greensheet.

The novel method of the present invention comprises the steps of:

(a) forming a laminate of a first thin metallized thermoplastic masking film and a greensheet by means of heat and pressure;

(b) radiation-machining the outer periphery of the desired large features such as wide vias, pads, seal bands, etc., to form peripheral cuts through desired corresponding areas of the first masking film to the greensheet, forming isolated large feature film areas;

(c) selecting a second thin thermoplastic stencil film and forming corresponding large feature openings therein, such as by punching or, more preferably, by radiation-machining the outer periphery of the desired large feature areas, such as wide vias, pads seal bands, etc., in identical manner to the radiation machining in step (b), and removing the punched or machined features from the stencil film to produce large feature-openings therein corresponding in size and location to the isolated cut areas of the masking film;

(d) superimposing and laminating, such as by heat and pressure, the stencil film over the first masking film, with the feature openings of the stencil film and the machined feature areas of the masking film in perfect alignment, said openings isolating said stencil machined feature areas against the lamination pressure;

(e) pressing a flexible pressure adhesive element into the feature openings of the stencil film and pressure-bonding it to the machined, isolated large feature areas of the first masking film;

(f) separating the stencil film, adhesive element and adhered machined feature areas of the first masking film from the first masking film to expose large feature surface areas of the greensheet;

(g) applying conductive ink paste over the surface of the first masking film to fill the voided large feature areas in the masking film and metallize the surface of the greensheet while masking background surface areas of the greensheet, and (h) stripping away the first masking film to produce the greensheet containing the metallized large feature areas on the surface thereof.

In essence, the novel process of the present invention permits the formation of metallized large feature areas on the surface of a greensheet, without the requirement for precision printing techniques and without contaminating adjacent surface areas of the greensheet, and without damaging the surface of the greensheet.

DETAILED DESCRIPTION

Figure 1:
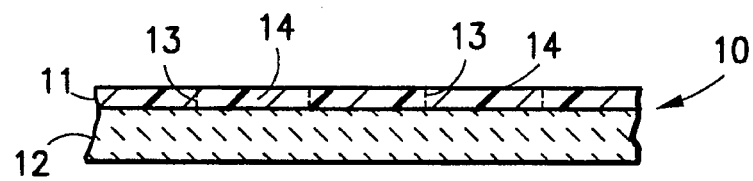
FIG. 1 is a diagrammatic cross-section, to an enlarged scale, of a laminate of a dielectric ceramic greensheet and a metallized plastic masking film which has large feature areas outline-imaged therethrough by a radiation beam.

Referring to the Drawings, FIG. 1 illustrates a laminate 10 of a first plastic masking film 11, such as of metallized Mylar polyethylene terephthalate, adhered by means of pressure and temperature, such as by pressing at about 377 psi for one minute at 60° C., to a dielectric substrate 12 such as a high alumina-content ceramic greensheet. The laminate 10 is exposed to a narrow high intensity energy beam, such as a laser beam, electron beam, photon beam, etc, focused against the metallized upper surface of the film 11, and computer guided to trace and ablate the narrow outlines 13 of desired large feature isolated areas 14, generally without affecting the surface of the substrate 12 other than by fusing the film to the greensheet surface in the areas of the outlines 13.

Figure 3:
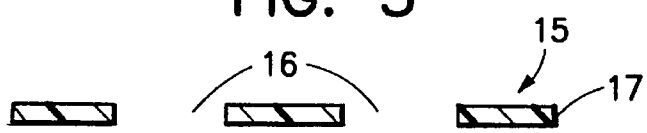
FIG. 3 illustrates the film of FIG. 2, with the outlined image areas removed, to provide a stencil film.

Next a stencil film 15 having open large feature open areas 16 corresponding to isolated areas 14 in the first plastic film 11 of FIG. 1, as shown in FIG. 3, is preferably produced by selecting a second plastic film 17, such as of Mylar, and focusing thereagainst a narrow high intensity energy beam, such as a laser beam, electron beam, photon beam, etc, to trace and ablate narrow outlines 18 of desired large feature areas 19 corresponding to outlines 13 and isolated feature areas 14 of FIG. 1, and removing the detached large feature isolated areas 19 to produce the open areas 16 shown in FIG. 3. Alternatively the stencil film may be cut by mechanical punching or other cutting means.

Figure 4:
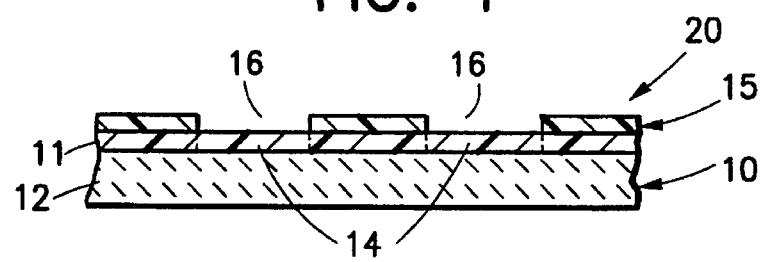
FIG. 4 illustrates an assembly of the stencil film of FIG. 3 superposed and laminated in alignment over the sub-laminate of FIG. 1, the shape and dimensions of the stencil openings corresponding to the shape and dimensions of the outline-imaged areas of the masking film of the laminate.

In the next step, illustrated by FIG. 4, the stencil film 15 is laminated by heat and platen pressure against the first film greensheet laminate 10, shown in FIG. 1, so that the large feature open areas 16 of the stencil film and the corresponding large feature outlines 13 of the masking film 11 are in exact registration, to form stencil laminate 20. Platen pressure applied to the upper surface of the stencil sheet 15 is not exerted against the isolated feature areas 14 of the masking film 11, because of the openings 16.

Figure 5:
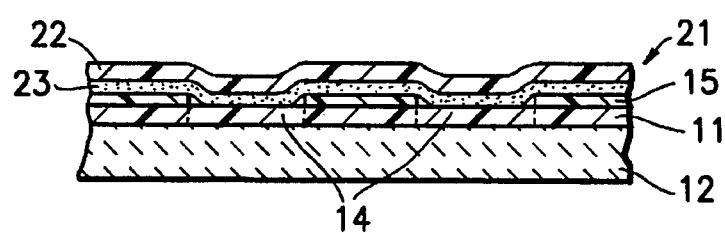
FIG. 5 is a diagrammatic cross-section, to an enlarged scale, of an adhesive pick-off sheet having a soft adhesive layer pressed against the stencil sheet of the assembly of FIG. 4, the adhesive layer penetrating the stencil openings to contact the outline-imaged areas of the masking film on the greensheet.
Figure 6:
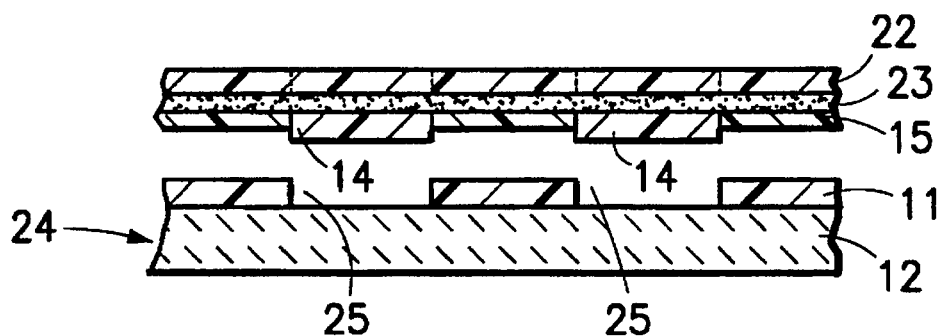
FIG. 6 illustrates the separation of the laminate of FIG. 1 from the other sheets of FIG. 5, the outline-imaged areas of the masking film being removed by the adhesive pick-off sheet to produce a masked, open-image greensheet.

A pressure-adhesive sheet 21, such as a plastic film 22 carrying a soft adhesive layer 23 is locally pressed against the openings 16 in the upper surface of the stencil film 15 of the laminate 20 of FIG. 4, as shown in FIG. 5. The adhesive layer 23 contacts and adheres to the isolated areas 14 of the masking film 11, through open stencil areas 16, and removes the isolated areas 14 from the surface of the ceramic greensheet substrate 12 when the stencil film 15 is peeled away from the laminate 10, carrying with it the adhesive sheet 21 and the isolated large image areas 19 which have stronger bonding affinity for the adhesive layer 23 than for the ceramic substrate 12, as illustrated by FIG. 6. The formed masked substrate 24 comprises the ceramic greensheet 12, the first plastic film and open large image areas 25 from which the isolated areas 19 have been removed. The masked substrate 24 permits the surface of the film 11 to be wiped with conductive paste to fill the large image areas 25, corresponding to seal bonds, wire bond pads and I/O pin pads, in simple fashion, with paste images 26 without contaminating adjacent surface areas of the substrate 12 with the conductive paste.

Figure 7:
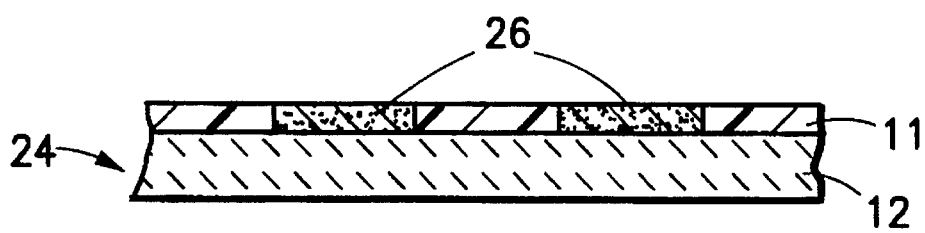
FIG. 7 illustrates the masked, open-image greensheet of FIG. 6 with the open-image areas filled with electroconductive paste.

As illustrated by FIG. 7, the masked substrate 24 has applied over the surface of the masking film 11, such as by means of a squeegee or coating blade, a conventional electroconductive printing ink paste 26 which is inert with respect to the plastic film 11, and which fills the open image areas 25 and bonds to the surface of the greensheet substrate 12. Upon separation of the film 11 from the electroded greensheet 27 the latter carries sharply outlined large area electroconductive images 28. Any background electroconductive paste is present on the surface of the film 11 and is withdrawn therewith during the sheet separation step. Thus, the substrate 12 is electroded cleanly and in simple manner, without the need for precision printing techniques and without the possibility of contaminating or damaging surface areas of the greensheet, adjacent the wide area electroconductive images 28, with conductive paste particles which otherwise might cause shorting between adjacent, closely-spaced fine line circuitry.

A plurality of electroded, circuitized ceramic green sheets of the desired configuration are produced, assembled, laminated and fired in conventional manner to form multi-layer ceramic interconnection packages. Integrated circuit chips can be bonded to the surface of such MLC packages, and interconnection means such as pinning or lead frame can be applied to contact the lowermost surface, as disclosed in U.S. Pat. No. 3,956,052.

The essential difference between the present invention and that of commonly-owned U.S. Pat. No. 3,956,052 is the discovery of an improved process for forming large or wide area features on ceramic greensheets, such as seal bands, wire bond pads and I/O pin pads, using high accuracy, precision energy beam machining to outline the periphery of each wide area feature to be formed on the greensheet surface, thereby isolating the interior of said wide area feature from the remainder of the layer, and picking the isolated area from the remainder of the layer by means of an adhesive sheet, as illustrated by FIG. 6 of the drawings.

Figure 2:
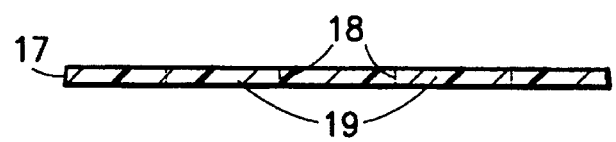
FIG. 2 is a diagrammatic cross-section, to an enlarged scale, of a second plastic film or stencil-forming film which is similarly outline-imaged with a radiation beam.
Figure 8:
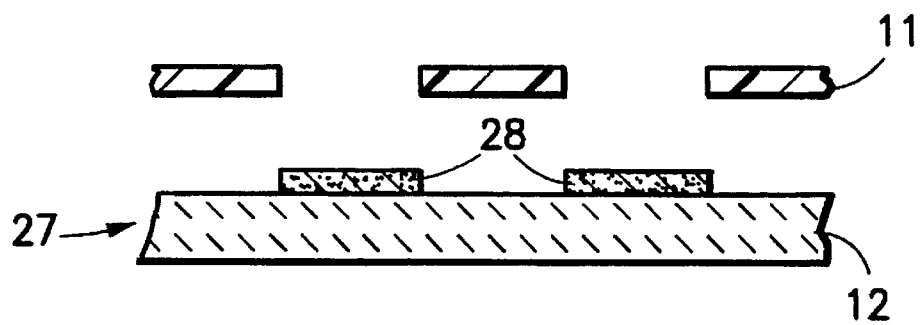
FIG. 8 illustrates the masking film and greensheet components of FIG. 7 separated, with the electroconductive images remaining bonded to the greensheet substrate.

Reference is made to commonly owned U.S. Pat. Nos. 5,124,522 and 5,145,551 for their disclosure of high precision energy beam systems for machining substrates such as masked ceramic greensheets to vaporize fine line portions of the masking film to form narrow vias and/or circuit outline areas into which electroconductive paste is flowed to form conductive circuits and/or electrodes on the greensheets. While such systems produce excellent results for the formation of narrow vias and/or fine line circuitry, they are too destructive, time-consuming or slow for use in the overall machining and ablation of wide area features. Thus, the present invention uses high intensity energy beams, such as laser beams, electron beams, photon beams, etc. to machine or vaporize only the outline 13 of large area features 14 to be formed through the masking film to the ceramic greensheet, as shown by FIG. 1 and then interposes the novel steps of forming a similarly imaged stencil film 15, as shown by FIGS. 2 and 3, aligning and bonding it, under heat and platen pressure, to the masking film 11 of the greensheet laminate 10, as shown by FIG. 4, the stencil openings 16 preventing the lamination pressure from being exerted against the outlined feature areas 14 whereby said areas remain lightly-bonded to the greensheet 12. This permits the pressure-application of an adhesive sheet 21 against stencil sheet 15 and into contact with the outlined feature areas 14 of the masking film 11, as shown by FIG. 5, for separation and withdrawal of isolated areas 14, as shown by FIG. 6 of the drawings. The stencil film 15 is peeled or separated from the masking film 11, leaving the latter in place over the greensheet 12 as a protective covering to facilitate the application of the electroconductive paste by simple rolling, wiping, doctor-blading or other means, after which the masking film 11 is peeled away to form the electroded greensheet 27 containing wide area features 28 present on the surface thereof as shown in FIG. 8.

As with the masking film 11, the stencil film 15 should also be mechanically-strong in order to permit peeling, and should be thermoplastic in order to permit heat and pressure bonding to the masking film 11 as shown in FIG. 4. The adhesive pick-off sheet useful according to the present invention comprises any flexible sheet having a soft adhesive layer capable of being pressed and deflected through the wide area feature openings 16 in the stencil film 15 to contact and adhere to the wide area peripherally-machined features 14 of the masking film 11. Preferably the adhesive pick-off sheet 2, as shown in FIGS. 5 and 6, comprises a flexible thin film foundation 22, such as a polyolefin, carrying a layer of a conventional pressure-adhesive composition as used on pressure-sensitive adhesive tapes such as Scotch tape.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for depositing wide area metallized interconnection features on a dielectric substrate, comprising the steps of:
   (a) laminating a thin, inert, thermoplastic masking film onto the surface of a dielectric, ceramic greensheet;
   (b) thermally-machining a continuous, thin parting line around the periphery of one or more wide areas on said masking film, to form isolated wide areas of said film corresponding to the wide area features to be metallized on said substrate;
   (c) forming corresponding wide area stencil openings in a thin, flexible thermoplastic film to provide a stencil film having wide area openings corresponding in size and location to the isolated wide areas of said masking film;
   (d) laminating said stencil film to said masking film, with said stencil openings and said isolated wide areas in alignment;
   (e) pressing an adhesive pick-off element against the stencil openings in said stencil film and into adhesive contact with the isolated wide areas of said masking film;
   (f) separating said stencil film from said masking film to remove the pick-off element and the isolated wide areas of the masking film adhered thereto, and to leave said masking film laminated to said greensheet, said masking film having openings in areas corresponding to the removed isolated wide areas;
   (g) applying a flowable electroconductive paste over said masking film and through the openings therein onto the surface of said greensheet to form thereon wide area metallized interconnection features, and
   (h) separating said masking film from said greensheet to form the metallized greensheet.

2. Method according to claim 1 in which said masking film comprises a tear-resistant film of polyethylene terephthalate polyester and, wherein a layer of metal is vacuum-metallized on a surface of the film which is spaced from said greensheet.

3. Method according to claim 1 in which said stencil film comprises a tear-resistant film of polyethylene terephthalate polyester.

4. Method according to claim 1 in which said greensheet comprises a high alumina-content ceramic composition.

5. Method according to claim 1 in which lamination step (a) is conducted under heat and pressure.

6. Method according to claim 1 in which the thermal-machining step (b) comprises the use of a high intensity energy beam.

7. Method according to claim 6 in which the energy beam comprises a laser beam.

8. Method according to claim 1 in which the wide area stencil openings are formed in step (c) by thermal machining means.

9. Method according to claim 8 in which the thermal machining means comprises the use of a high intensity energy beam.

10. Method according to claim 9 in which the energy beam comprises a laser beam.

11. Method according to claim 1 in which the lamination step (d) is conducted under heat and platen pressure whereby said pressure is not exerted against the isolated wide areas of the masking film.

12. Method according to claim 1 in which said adhesive pick off element comprises a sheet having a flexible thin film foundation carrying a layer of pressure-sensitive adhesive composition.

13. A method for depositing wide area metallized interconnection features on a dielectric substrate, comprising the steps of:
   (a) laminating a thin, inert, metallized thermoplastic masking film onto the surface of a dielectric, ceramic greensheet, the metallized surface of the film being spaced from the greensheet;
   (b) thermally-machining a continuous, thin parting line around the periphery of one or more wide areas on said masking film, to form isolated wide areas of said film corresponding to the wide area features to be metallized on said substrate;
   (c) forming corresponding wide area stencil openings in a thin, flexible thermoplastic film to provide a stencil film having wide area openings corresponding in size and location to the isolated wide areas of said masking film;
   (d) laminating said stencil film to said masking film, with said stencil openings and said isolated wide areas in alignment;
   (e) pressing an adhesive pick-off element against the stencil openings in said stencil film and into adhesive contact with the isolated wide areas of said masking film;
   (f) separating said stencil film from said masking film to remove the pick-off element and the isolated wide areas of the masking film adhered thereto, and to leave said masking film laminated to said greensheet, said film having openings in areas corresponding to the removed isolated wide areas;
   (g) applying a flowable electroconductive paste over said masking film and through the openings therein onto the surface of said greensheet to form thereon wide area metallized interconnection features, and (h) separating said masking film from said greensheet to form the metallized greensheet.

14. Method according to claime 13 in which the thermal machinery step (b) comprises the use of a high intensity energy beam.

15. Method according to claim 14 in which the energy beam comprises a laser beam.

* * * * *